(12) United States Patent
Shen et al.

(10) Patent No.: US 12,489,186 B2
(45) Date of Patent: Dec. 2, 2025

(54) CIRCUIT STRUCTURE

(71) Applicant: REALTEK SEMICONDUCTOR CORPORATION, Hsinchu (TW)

(72) Inventors: Tze-Min Shen, Hsinchu (TW); Hsin Hui Lo, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 429 days.

(21) Appl. No.: 18/150,727

(22) Filed: Jan. 5, 2023

(65) Prior Publication Data

US 2023/0216169 A1 Jul. 6, 2023

(30) Foreign Application Priority Data

Jan. 6, 2022 (TW) .................................. 111100623

(51) Int. Cl.
*H01P 3/08* (2006.01)
*H05K 1/02* (2006.01)
*H05K 1/11* (2006.01)

(52) U.S. Cl.
CPC .............. *H01P 3/08* (2013.01); *H05K 1/0298* (2013.01); *H05K 1/112* (2013.01); *H05K 1/0216* (2013.01); *H05K 2201/10734* (2013.01)

(58) Field of Classification Search
CPC ......... H01P 3/08; H01P 5/028; H05K 1/0298; H05K 1/112; H05K 1/0216; H05K 2201/10734; H05K 1/0219; H05K 1/0222; H05K 1/0243; H05K 1/0251; H05K 1/181; H05K 1/0228
See application file for complete search history.

(56) References Cited

U.S. PATENT DOCUMENTS

| 7,579,848 B2* | 8/2009 | Bottoms | G01R 1/07378 |
| | | | 324/762.01 |
| 2005/0176272 A1* | 8/2005 | Rosenau | H05K 1/112 |
| | | | 439/70 |
| 2018/0212306 A1* | 7/2018 | Elsherbini | H01Q 1/2283 |

FOREIGN PATENT DOCUMENTS

CN 108684139 A 10/2018

OTHER PUBLICATIONS

Office Action of Taiwanese counterpart 111100623 dated Oct. 14, 2022.

(Continued)

*Primary Examiner* — Andrea Lindgren Baltzell
*Assistant Examiner* — Kimberly E Glenn
(74) *Attorney, Agent, or Firm* — WPAT, P.C.; Anthony King

(57) ABSTRACT

A circuit structure includes a circuit board, microstrips, a stripline, and vias. The circuit board includes conductive levels. A first and second transceiving circuits are disposed on a first conductive level. A first microstrip is disposed on the first conductive level, and configured to couple a first pin of the first transceiving circuit to a second pin of the second transceiving circuit. A second and third microstrips are disposed on the first conductive level, and coupled to a third pin of the first transceiving circuit and a fourth pin of the second transceiving circuit, respectively. The stripline is disposed on a second conductive level. A first and second vias cross the first and second levels, and couple the second and third microstrips to the stripline. The first and third pins are an inner and outer pins of a front line of a BGA of the first transceiving circuit, respectively.

20 Claims, 3 Drawing Sheets

(56) References Cited

OTHER PUBLICATIONS

English abstract translation of CN108684139A.
English abstract translation of the Office Action of Taiwanese counterpart 111100623 dated Oct. 14, 2022.

* cited by examiner

CIRCUIT STRUCTURE

CROSS-REFERENCE TO RELATED APPLICATIONS

This application claims the benefit of priority to Patent Application No. 111100623, filed in Taiwan on Jan. 6, 2022, which is incorporated by reference in its entirety.

TECHNICAL FIELD

The present application relates to a circuit structure, particularly to a circuit structure including a microstrip and a stripline.

BACKGROUND

For circuits with a large number of signals, the wires are usually compressed rather densely as a result of the limitation of circuit wiring area. However, dense wires often leads to large amounts of interference (e.g., crosstalk). Therefore, how to control the interference between wires has become an important issue.

SUMMARY OF THE INVENTION

An aspect of the present disclosure provides a circuit structure configured to connect a first transceiving circuit and a second transceiving circuit. The circuit structure includes a circuit board, a first microstrip, a second microstrip, a third microstrip, a first stripline, a first via, and a second via. The circuit board includes a first conductive layer and a second conductive layer arranged in layers. The first transceiving circuit and the second transceiving circuit are disposed on the first conductive layer. The first microstrip is disposed on the first conductive layer and configured to couple a first pin of the first transceiving circuit to a second pin of the second transceiving circuit. The second microstrip is disposed on the first conductive layer and coupled to a third pin of the first transceiving circuit. The third microstrip is disposed on the first conductive layer and coupled to a fourth pin of the second transceiving circuit. The first stripline is disposed on the second conductive layer. The first via penetrates through the first conductive layer and the second conductive layer, and is configured to couple the second microstrip to the first stripline. The second via penetrates through the first conductive layer and the second conductive layer, and is configured to couple the third microstrip to the first stripline. The first pin is an inner pin of a front line of a ball grid array of the first transceiving circuit, and the third pin is an outer pin of the front line of the ball grid array of the first transceiving circuit.

Another aspect of the present disclosure provides a circuit structure connecting a control circuit and a memory circuit. The circuit structure includes a circuit board, first microstrips, and first composite conductive lines. The circuit board includes a first conductive layer and a second conductive layer arranged in layers. The control circuit and the memory circuit are disposed on the first conductive layer. The first microstrips are disposed on the first conductive layer and respectively couple first pins of the control circuit to second pins of the memory circuit. The first composite conductive lines respectively couple third pins of the control circuit to fourth pins of the memory circuit. Each of the first composite conductive lines is disposed on the first conductive layer and the second conductive layer. The first pins are inner pins of a front line of a ball grid array of the control circuit, and the third pins are outer pins of the front lines of the ball grid array of the control circuit.

Compared to the conventional technology, the circuit structure of the present disclosure reduces the crosstalk between wires by using the configuration of striplines and does not increase the wiring area.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
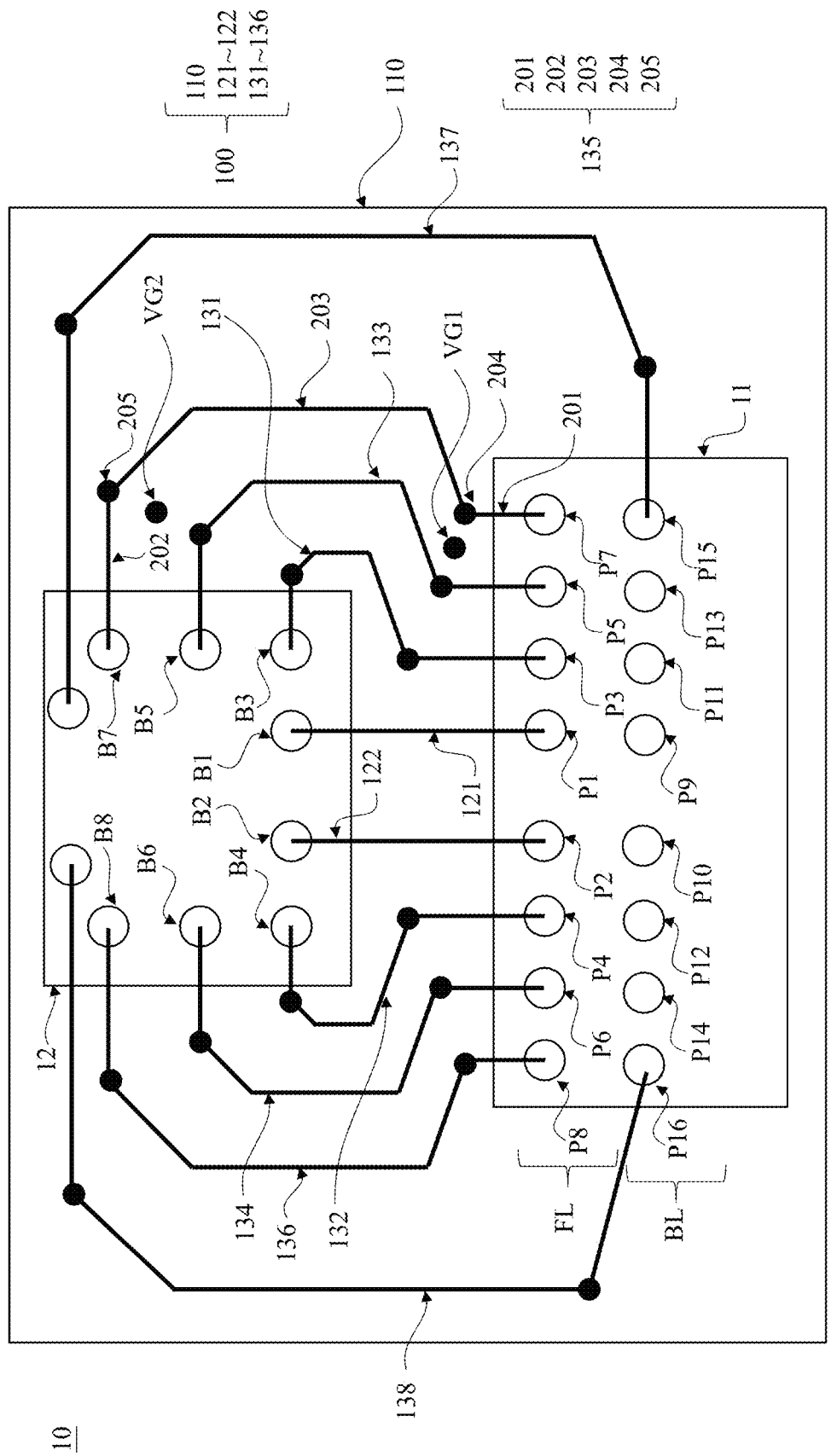
FIG. 1 is a top view perspective of a circuit system according to some embodiments of the present disclosure.

FIG. 1 is a schematic top view illustrating a circuit system 10 according to some embodiments of the present disclosure. The circuit system 10 includes a first transceiving circuit 11, a second transceiving circuit 12, and a circuit structure 100 connecting the first transceiving circuit 11 and the second transceiving circuit 12.

The circuit structure 100 includes a circuit board 110, microstrips 121-122 and composite conductive lines 131-136. The microstrips 121-122 and the composite conductive lines 131-136 are disposed on the circuit board 110 and configured to connect the first transceiving circuit 11 and the second transceiving circuit 12. It is noted that the numbers of the microstrips 121-122 and the composite conductive lines 131-136 are illustrative, and the present disclosure is not limited thereto.

In some embodiments, the second transceiving circuit 12 is a memory circuit, whereas the first transceiving circuit 11 is a control circuit configured to control the memory circuit. In some other embodiments, the first transceiving circuit 11 is a memory circuit, whereas the second transceiving circuit 12 is a control circuit configured to control the memory circuit. In other words, both the first transceiving circuit 11 and the second transceiving circuit 12 are capable of transmitting and receiving. For ease of understanding, the present disclosure is explained using the signal transmitted from the first transceiving circuit 11 to the second transceiving circuit 12, whereas the operations in the opposite direction are omitted.

The first transceiving circuit 11 includes pins P1-P16. The second transceiving circuit 12 includes the pins B1-B8. The first transceiving circuit 11 and the second transceiving circuit 12 transmit signals through the pins P1-P8 and the pins B1-B8, respectively. Specifically, the microstrips 121-122 respectively couple the pins P1-P2 to the pins B1-B2, and the composite conductive lines 131-136 respectively couple the pins P3-P8 to the pins B3-B8. For ease of understanding, the wires connecting the pins P9-P16 are not shown in the drawings. In other embodiments, the wires connecting the pin P9-P16 are connected to the second transceiving circuit 12 or other circuits.

Because the available area of the circuit board 110 is limited, the microstrips 121-122 and the composite conductive lines 131-136 are arranged at the shortest distance. However, the length of the microstrips 121-122 and the composite conductive lines 131-136 are different. When there are longer wires (especially for the microstrips) on the circuit board, the crosstalk generated on them is also larger. In view of the fore-going issues, the present disclosure provides a special set of circuit structure 100 to reduce the effect of crosstalk, the details of which are described below.

As shown in the top view of FIG. 1, the microstrips 121-122 are set in straight lines, the composite conductive lines 131-136 are set in non-straight lines, wherein the microstrips 121-122 have the shortest length among the microstrips 121-122 and the composite conductive lines 131-136. Specifically, the pins P1-P16 of the first transceiving circuit 11 are arranged as a ball grid array BGA. The ball grid array BGA can be divided into a front line FL and a back line BL with respect to the second transceiving circuit 12, wherein the front line FL includes the pins P1-P8, and the back line BL includes the pin P9-P16. On the inner side of the front line FL, the inner pins P1-P2 are the closest to the second transceiving circuit 12, so that are directly connected to the second transceiving circuit 12 using the straight microstrips 121-122 from the pins P1-P2, wherein the microstrips 121-122 are disposed on the surface of the circuit board 110 (i.e., the conductive layer 111 shown in FIG. 2). In addition, there are outer pins P3-P8 of the front line FL, and in order not to overlap with each other, the pins P3-P8 are connected to the second transceiving circuit 12 with non-straight composite conductive lines 131-136.

In some other embodiments, the microstrips 121-122 may also be arranged in non-straight lines, as long as the microstrips 121-122 still have the shortest length among the microstrips 121-122 and the composite conductive lines 131-136.

In some embodiments, the crosstalk generated by the stripline is lower than the crosstalk generated by the microstrip for the same length. Since the length of the composite conductive lines 131-136 is longer than that of the microstrips 121-122, the circuit structure 100 uses the stripline to set up at least part of each of the composite conductive lines 131-136 to reduce the use of the microstrips, thereby reducing the crosstalk.

Figure 2:
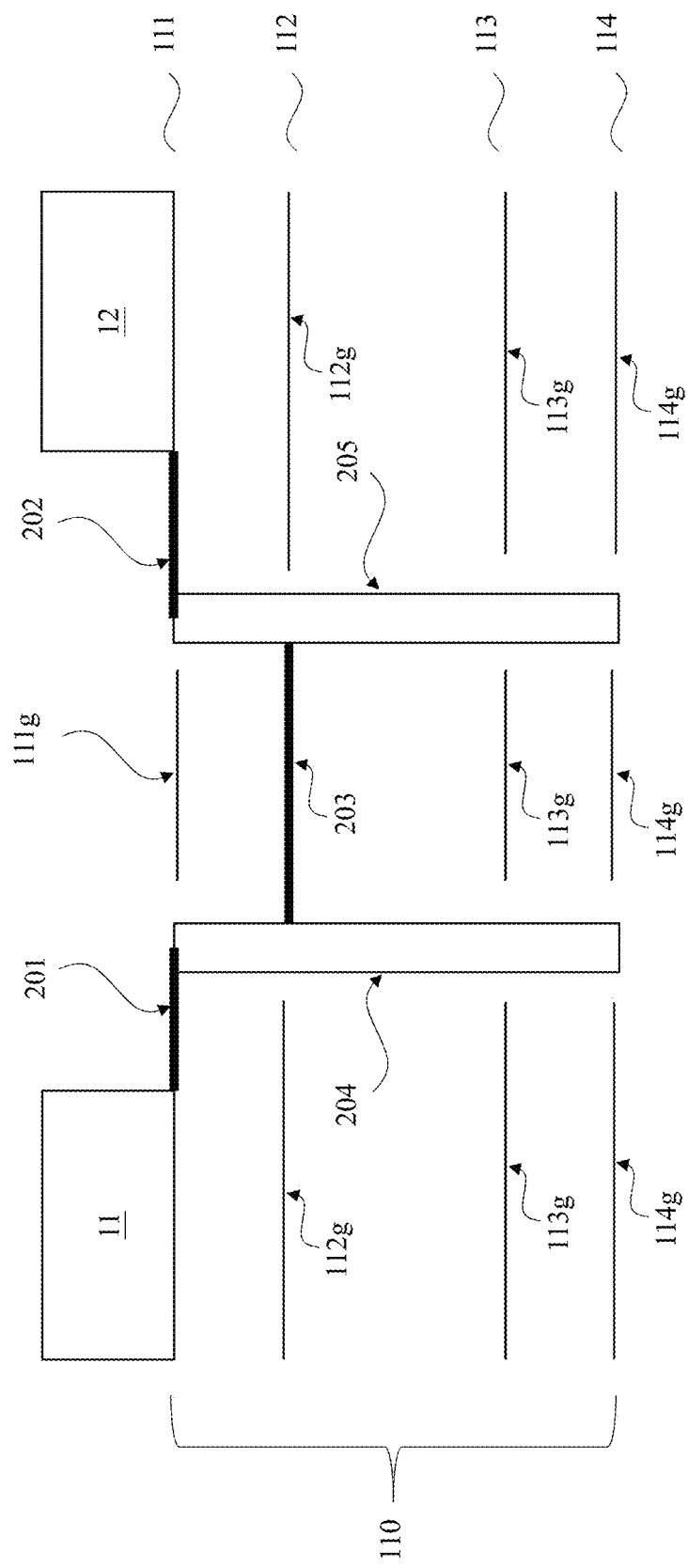
FIG. 2 is a side view perspective of a circuit system according to some embodiments of the present disclosure.

Reference is made to FIG. 1 and FIG. 2. FIG. 2 is a schematic side view illustrating the circuit system 10 according to some embodiments of the present disclosure. As can be seen from the side view of the circuit system 10, the circuit board 110 is a multi-layer structure including conductive layers 111-114 arranged in layers. The first transceiving circuit 11 and the second transceiving circuit 12 are disposed on top of the conductive layer 111 at the surface. In some embodiments, the circuit board 110 only includes the conductive layers 111-112. In some embodiments, the circuit board 110 further includes more conductive layers. In some embodiments, the distance between the conductive layer 111 and the conductive layer 112 equals to the distance between the conductive layer 113 and the conductive layer 114. In some embodiments, the distance between the conductive layer 111 and the conductive layer 112 is less than the distance between the conductive layer 112 and the conductive layer 113. For ease of understanding, only the composite conductive line 135 is shown in FIG. 2, and the remaining composite conductive lines and microstrip lines are omitted.

The composite conductive lines 135 includes a microstrip 201, a microstrip 202, a stripline 203, a via 204 and a via 205. The microstrip 201 and the microstrip 202 are disposed on the conductive layer 111. The stripline 203 is disposed on the conductive layer 112. The via 204 and the via 205 are disposed in the circuit board 110 and penetrate through the conductive layer 111 to the conductive layer 114.

The microstrip 201 is configured to couple the pin P7 to the via 204. The stripline 203 is configured to couple the pin B7 to the via 205. The stripline 203 is coupled between the via 204 and the via 205, and is coupled to the microstrip 201 and the microstrip 202 through the via 204 and the via 205, respectively. In this configuration, the composite conductive lines 135 transmits signals between the pin P7 and the pin B7 sequentially through the microstrip 201, the via 204, the stripline 203, the via 205 and the microstrip 202.

The conductive layer 111 has a ground pad 111g, and the conductive layer 112 has a ground pad 112g. In the top view, the stripline 203 overlaps with a portion of the ground pad 111g, and the microstrip 201 and the microstrip 202 overlap with a portion of the ground pad 112g.

Based on similar arrangements, each of the composite conductive lines 131-134 and 136 also includes the microstrip 201, the microstrip 202, the stripline 203, the via 204 and the via 205, and the plurality of the microstrips 201 and the microstrips 202 also overlap with a portion of the ground pad 112g, and the plurality of the striplines 203 also overlap with a portion of ground pad 111g.

The circuit structure 100 further includes ground vias VG1-VG2 penetrating through the conductive layers 111-114. The ground vias VG1-VG2 are configured to couple the ground pad 111g to the ground pad 112g, so that the ground pad 111g and the ground pad 112g, as a whole, form a ground shielding to the composite conductive lines 131-136. In some embodiments, the conductive layer 113 includes a ground pad 113g, wherein the ground vias VG1-VG2 are further configured to couple the ground pad 111g and the ground pad 112g to the ground pad 113g, such that the ground pad 111g, the ground pad 112g and the ground pad 113g, as a whole form, form a ground shielding to the composite conductive lines 131-136. In further embodiment, the conductive layer 114 includes a ground pad 114g, wherein the ground vias VG1-VG2 are further coupled to the ground pad 111g, the ground pad 112g, the ground pad 113g and the ground pad 114g, such that the ground pad 111g, the ground pad 112g, the ground pad 113g and the ground pad 114g, as a whole, form a ground shielding to the composite conductive lines 131-136. In some embodiments, the circuit structure 100 further includes other ground vias, and the present disclosure does not limit the number of the ground vias. For example, other ground vias can be arranged between the via 205 of the composite conductive lines 134 and 136.

In some embodiments, the ground vias VG1-VG2 are configured to decrease the coupling interference between the neighboring via 204 and/or via 205. As shown in FIG. 1, the ground via VG1 is disposed between the via 204 of the composite conductive lines 135 and the via 204 of the composite conductive lines 133, which is configured to decrease the coupling interference between the via 204 of the composite conductive lines 135 and the via 204 of the composite conductive lines 133.

In some conventional art, the vias are arranged densely, which makes the coupling interference between the vias higher. However, because of the dense arrangement of vias, it is difficult to provide additional grounding vias between them unless a larger wiring area is used. Compared with the conventional art, the present disclosure chooses to place the grounding vias VG1-VG2 between the vias 204 and/or vias 205 of the composite conductive lines 131-136. Because the composite conductive lines 131-136 are coupled to the outer pins P3-P6 of the ball grid array, compared to the microstrips 121-122 connected to the inner pins P1-P2, the composite conductive lines 131-136 can have more wiring area to be used, and it is also easier to arrange additional grounding vias VG1-VG2. In the configuration of the present disclosure, even with grounding vias VG1-VG2, the composite conductive lines 131-136 do not need to occupy additional wiring area.

Figure 3:
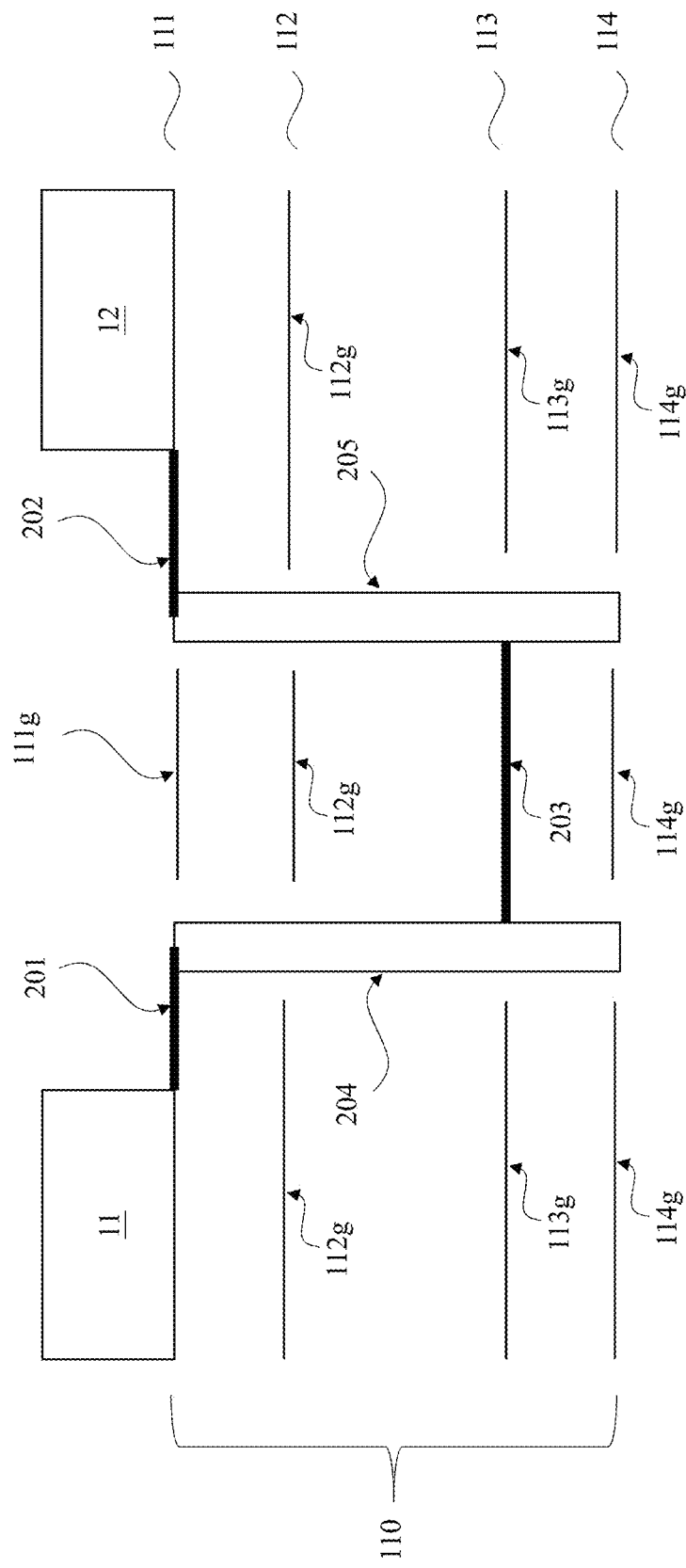
FIG. 3 is a side view perspective of a circuit system according to some other embodiments of the present disclosure.

Reference is made to FIG. 3. FIG. 3 is a schematic side view illustrating a circuit system 10 according to some other embodiments of the present disclosure. The microstrip 201, the microstrip 202, the via 204 and the via 205 of the composite conductive lines 135 in FIG. 3 are the same as the embodiments shown in FIG. 2, except that the stripline 203 is disposed on the conductive layer 113. The conductive layer 114 includes a ground pad 114g, and the stripline 203 in FIG. 3 overlaps with a portion of the ground pad 112g and the ground pad 114g in the top view. The ground vias VG1-VG2 are configured to couple the ground pad 112g, the ground pad 113g and the ground pad 114g, such that the ground pad 112g, the ground pad 113g and the ground pad 114g, as a whole, form a ground shielding to the composite conductive lines 135.

As could be appreciated that in FIG. 3, the composite conductive lines 135 is only used as an illustrative example, and the present disclosure is not limited thereto. Any of the composite conductive lines 131-136 can be arranged following the embodiments in FIG. 3.

In some embodiments, the circuit structure 100 includes composite conductive lines 137-138. The composite conductive lines 137-138 are respectively coupled to outer pin P15-P16 in the back line of the ball grid array of the first transceiving circuit 11. In some embodiments, the composite conductive lines 137-138 can be arranged following the embodiments in FIG. 2 and/or FIG. 3.

The foregoing description briefly sets forth the features of some embodiments of the present application so that persons having ordinary skill in the art more fully understand the various aspects of the disclosure of the present application. It will be apparent to those having ordinary skill in the art that they can easily use the disclosure of the present application as a basis for designing or modifying other processes and structures to achieve the same purposes and/or benefits as the embodiments herein. It should be understood by those having ordinary skill in the art that these equivalent implementations still fall within the spirit and scope of the disclosure of the present application and that they may be subject to various variations, substitutions, and alterations without departing from the spirit and scope of the present disclosure.

What is claimed is:

1. A circuit structure, configured to connect a first transceiving circuit and a second transceiving circuit, comprising:
   a circuit board, comprising a first conductive layer and a second conductive layer arranged in layers, wherein the first transceiving circuit and the second transceiving circuit are disposed on the first conductive layer;
   a first microstrip, disposed on the first conductive layer and configured to couple a first pin of the first transceiving circuit to a second pin of the second transceiving circuit;
   a second microstrip, disposed on the first conductive layer and coupled to a third pin of the first transceiving circuit;
   a third microstrip, disposed on the first conductive layer and coupled to a fourth pin of the second transceiving circuit;
   a first stripline, disposed on the second conductive layer;
   a first via, penetrating through the first conductive layer and the second conductive layer, and configured to couple the second microstrip to the first stripline; and
   a second via, penetrating through the first conductive layer and the second conductive layer, and configured to couple the third microstrip to the first stripline,
   wherein the first pin is an inner pin of a front line of a ball grid array of the first transceiving circuit, and the third pin is a first outer pin of the front line of the ball grid array of the first transceiving circuit.

2. The circuit structure of claim 1, wherein the circuit board further comprises a third conductive layer and a fourth conductive layer, wherein the first conductive layer, the second conductive layer, the third conductive layer and the fourth conductive layer are laminated in sequence, wherein a distance between the first conductive layer and the second conductive layer is less than a distance between the second conductive layer and the third conductive layer.

3. The circuit structure of claim 2, wherein the distance between the first conductive layer and the second conductive layer equals to a distance between the third conductive layer and the fourth conductive layer.

4. The circuit structure of claim 2, further comprising:
   a fourth microstrip, disposed on the first conductive layer;
   a fifth microstrip, disposed on the first conductive layer;
   a second stripline, disposed on the third conductive layer;
   a third via, penetrating through the circuit board and configured to couple the fourth microstrip to the second stripline; and
   a fourth via, penetrating through the circuit board and configured to couple the fifth microstrip to the second stripline.

5. The circuit structure of claim 4, wherein the fourth microstrip is coupled to a fifth pin the first transceiving circuit, and the fifth microstrip is coupled to a sixth pin of the second transceiving circuit.

6. The circuit structure of claim 5, wherein the fifth pin is a second outer pin of the front line of the ball grid array of the first transceiving circuit, wherein the first outer pin of the front line is different from the second outer pin of the front line.

7. The circuit structure of claim 5, wherein the fifth pin is an external pin of a back line of the ball grid array of the first transceiving circuit.

8. The circuit structure of claim 1, wherein the first conductive layer comprises a first ground pad, and the second conductive layer comprises a second ground pad, wherein the first stripline overlaps a portion of the first ground pad in a top view, and the second microstrip overlaps a portion of the second ground pad in the top view.

9. The circuit structure of claim 8, further comprising:
   a fifth via, penetrating through the circuit board and configured to couple the first ground pad and the second ground pad.

10. The circuit structure of claim 9, wherein the fifth via, the first ground pad and the second ground pad as a whole form a ground shielding.

11. A circuit structure, connecting a control circuit and a memory circuit, comprising:
    a circuit board, comprising a first conductive layer and a second conductive layer arranged in layers, wherein the control circuit and the memory circuit are disposed on the first conductive layer;

a plurality of first microstrips, disposed on the first conductive layer and respectively coupling a plurality of first pins of the control circuit to a plurality of second pins of the memory circuit; and a plurality of first composite conductive lines, respectively coupling a plurality of third pins of the control circuit to a plurality of fourth pins of the memory circuit, wherein each of the plurality of first composite conductive lines is disposed on the first conductive layer and the second conductive layer, wherein the plurality of first pins are inner pins of a front line of a ball grid array of the control circuit, and the plurality of third pins are first outer pins of the front lines of the ball grid array of the control circuit.

12. The circuit structure of claim 11, wherein the plurality of first composite conductive lines comprise:

a plurality of second microstrips, disposed on the first conductive layer and respectively coupled to the plurality of third pins of the control circuit;

a plurality of third microstrips, disposed on the first conductive layer and respectively coupled to the plurality of fourth pins of the memory circuit;

a plurality of first striplines, disposed on the second conductive layer;

a plurality of first vias, penetrating through the first conductive layer and the second conductive layer and configured to respectively couple the plurality of second microstrips to the plurality of first striplines; and a plurality of second via, penetrating through the first conductive layer and the second conductive layer and configured to respectively couple the plurality of third microstrips to the plurality of first striplines.

13. The circuit structure of claim 11, wherein the circuit board further comprises a third conductive layer and a fourth conductive layer, wherein the first conductive layer, the second conductive layer, the third conductive layer and the fourth conductive layer are laminated in sequence, wherein a distance between the first conductive layer and the second conductive layer is less than a distance between the second conductive layer and the third conductive layer.

14. The circuit structure of claim 13, wherein the distance between the first conductive layer and the second conductive layer equals to a distance between the third conductive layer and the fourth conductive layer.

15. The circuit structure of claim 13, further comprising:
a plurality of second composite conductive lines, respectively coupling a plurality of fifth pins of the control circuit to a plurality of sixth pins of the memory circuit, wherein each of the plurality of second composite conductive lines is disposed on the third conductive layer and the first conductive layer.

16. The circuit structure of claim 15, wherein the plurality of second composite conductive lines comprises:

a plurality of fourth microstrips, disposed on the first conductive layer and respectively coupled to the plurality of fifth pins of the control circuit;

a plurality of third microstrips, disposed on the first conductive layer and respectively coupled to the plurality of sixth pins of the memory circuit;

a plurality of second striplines, disposed on the third conductive layer;

a plurality of third vias, penetrating through the first conductive layer, the second conductive layer, the third conductive layer and the fourth conductive layer, and configured to respectively couple the plurality of fourth microstrips to the plurality of second striplines; and a plurality of fourth via, penetrating through the first conductive layer, the second conductive layer, the third conductive layer and the fourth conductive layer, and configured to respectively couple the plurality of fifth microstrip to the plurality of second striplines.

17. The circuit structure of claim 15, wherein the plurality of fifth pins are second outer pins of the front line of the ball grid array of the control circuit, wherein the first outer pins of the front line are different from the second outer pins of the front line.

18. The circuit structure of claim 15, wherein the plurality of fifth pins are external pins of a back line of the ball grid array of the control circuit.

19. The circuit structure of claim 11, wherein the first conductive layer comprises a first ground pad, and the second conductive layer comprises a second ground pad, wherein each of the plurality of first striplines overlaps a portion of the first ground pad in a top view, and each of the plurality of second microstrips overlaps a portion of the second ground pad in a top view.

20. The circuit structure of claim 19, further comprising:
a ground via, penetrating through the circuit board and coupled to the first ground pad and the second ground pad, wherein the ground via, the first ground pad and the second ground pad as a whole form a ground shielding.

* * * * *